United States Patent
Tanabe et al.

(10) Patent No.: US 6,680,959 B2
(45) Date of Patent: Jan. 20, 2004

(54) SEMICONDUCTOR LIGHT EMITTING DEVICE AND SEMICONDUCTOR LASER

(75) Inventors: Tetsuhiro Tanabe, Kyoto (JP); Norikazu Ito, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 09/906,698

(22) Filed: Jul. 18, 2001

(65) Prior Publication Data

US 2002/0027933 A1 Mar. 7, 2002

(30) Foreign Application Priority Data

Jul. 18, 2000 (JP) .................................. 2000-217090

(51) Int. Cl.[7] .............................................. H01S 5/00
(52) U.S. Cl. ................................................ 372/45; 372/46
(58) Field of Search .............................. 372/43, 5, 46, 372/49

(56) References Cited

U.S. PATENT DOCUMENTS

| | | | |
|---|---|---|---|
| 5,585,648 A | * 12/1996 | Tischler | 257/77 |
| 5,604,763 A | * 2/1997 | Kato et al. | 372/45 |
| 5,727,008 A | * 3/1998 | Koga | 372/43 |
| 5,843,227 A | * 12/1998 | Kimura et al. | 117/101 |
| 5,864,171 A | * 1/1999 | Yamamoto et al. | 257/627 |
| 6,072,197 A | * 6/2000 | Horino et al. | 257/103 |
| 6,080,599 A | * 6/2000 | Yamamoto et al. | 438/33 |
| 6,163,557 A | * 12/2000 | Dunnrowicz et al. | 372/46 |
| 6,232,623 B1 | * 5/2001 | Morita | 257/103 |

* cited by examiner

*Primary Examiner*—Paul Ip
*Assistant Examiner*—Tuan Nguyen
(74) *Attorney, Agent, or Firm*—Arent Fox Kintner Plotkin & Kahn, PLLC

(57) ABSTRACT

When a laminated semiconductor portion of nitride based compound semiconductor is formed so as to constitute a portion forming a light emitting layer forming portion on a sapphire substrate, the sapphire substrate has an off orientation angle having a tilt relative to an A axis or a M axis in such a way that $0.2° \leq \theta = \{\theta_a^2 + \theta_m^2\}^{1/2} \leq 0.3°$, wherein $0° \leq \theta_a \leq 0.3°$, $0° \leq \theta_m \leq 0.3°$, when taking the angle tilted relative to the A axis as $\theta_a$ and to the M axis as $\theta_m$, and the foregoing nitride based compound semiconductor layers are laminated onto the surface of the off-oriented C plane. Therefore, it is possible to attain a semiconductor light emitting device having the superior characteristic of light emitting by growing the nitride based compound semiconductor on a sapphire substrate with the degree of flatness high and furthermore to attain a semiconductor laser of a small threshold current by forming a cleavage surface finely while improving the degree of flatness by off-orienting a sapphire substrate.

8 Claims, 4 Drawing Sheets

SEMICONDUCTOR LIGHT EMITTING DEVICE AND SEMICONDUCTOR LASER

FIELD OF THE PRESENT INVENTION

The present invention relates to a semiconductor light emitting device such as a semiconductor laser or a light emitting diode which uses a nitride based compound semiconductor (compound semiconductor of Group III element (s) and nitrogen and the like) and is capable of emitting light in the blue type region required for an optical disk memory having a high recording density or a laser beam printer with high definition. More specifically, the present invention relates to a semiconductor light emitting device and a semiconductor laser having such a superior light emitting characteristic as to reduce a threshold current by growing a semiconductor layer having few crystalline defects and the flat surface.

BACKGROUND OF THE PRESENT INVENTION

A conventional light emitting diode (LED) or laser diode (LD) emitting light in a blue-emitting region has been fabricated by successively forming compound semiconductor of group III element nitrides on a sapphire substrate by Metal Organic Chemical Vapour Deposition (hereinafter referred to as MOCVD).

For example, a semiconductor laser capable of carrying out CW oscillation in a blue-emitting region is fabricated as shown in FIG. 5 by successively forming layers of group III element nitride based compound semiconductor on a sapphire substrate 21 by the MOCVD method; a GaN buffer layer 22, a contact layer 23 of an n-type GaN, an n-type clad layer 24 of $Al_{0.12}Ga_{0.88}N$, an n-type light guide layer 25 of GaN, an active layer 26 of an InGaN based (type) compound semiconductor with multiple quantum well structure, a p-type light guide layer 27 of a p-type GaN, a p-type clad layer 28 of a p-type $Al_{0.12}Ga_{0.88}N$, and a p-type contact layer 29 of a p-type GaN; etching some of the layered semiconductor layers as shown in FIG. 5 by, for example, dry etching to expose the n-type contact layer 23, and forming an n-side electrode 31 thereon and a p-side electrode 30 on the foregoing p-type contact layer 29, respectively. The portion of the p-side electrode 30 along the stripes is utilized as the light emitting part.

However, the sapphire substrate on which the nitride based compound layers are grown has considerably different lattice constant and thermal expansion coefficient from those of the nitride based compound semiconductor layers and it is difficult to get the lattice match between them. Further, the density of the threading dislocation (TD) of the nitride based compound semiconductor layers grown thereon is as high as about $1 \times 10^8$ $cm^{-2}$ to $1 \times 10^{10}$ $cm^{-2}$ and the dislocation density is significantly high as compared with that, $1 \times 10^2$ $cm^{-2}$, of compound semiconductor layers of the red-emitting type grown on GaAs substrate. In case of semiconductor lasers, if the dislocation density is especially high, the threshold current is increased, so that it is desired to lower the dislocation density than the LEDs (light emitting diode). However, other than sapphire, any alternative substrate suitable for industrial use has not been found.

On the other hand, various studies have been carried out to grow the nitride based compound semiconductor layer which is flat in a plane and small in a dislocation density, and various methods of using a off-oriented substrate, for example, disclosure that semiconductor layers of gallium nitride based compound are grown onto a sapphire substrate of which R plane is off-oriented by 0.8° or low as shown in Japanese Unexamined Patent Publication No. Hei 5-190903 are proposed.

As described above, though some contrivances to improve the flatness of the nitride based compound semiconductor layer and to reduce a dislocation density are performed, these are only the proposals such that, it is sufficient to be off-oriented even slightly such as not greater than 0.8° or not greater than 1.0° regarding the off orientation angle, and it is not minded in which crystalline axis direction the substrate should be off-oriented. Therefore, the nitride based compound semiconductor layers having the flat surface are not always attained and the semiconductor lasers having the high performance have not been commercialized.

SUMMARY OF THE PRESENT INVENTION

The present invention has been performed in consideration of these circumstances, and it is an object to provide a semiconductor light emitting device having a superior characteristic of light emitting by growing the nitride based compound semiconductor layers with the degree of high flatness on a sapphire substrate.

It is another object of the present invention to provide a semiconductor laser of a structure capable of enhancing the characteristic such that a threshold current density is reduced by forming a cleavage surface finely while improving the degree of flatness by off-orienting the sapphire substrate in the case such as a semiconductor laser in which a laser beam exit edge surface is fabricated through cleavage.

The present inventors studied seriously to make a surface of the growing layer of the nitride based compound semiconductor flat and a dislocation density small by off-orienting the sapphire substrate, and therefore have found that the flatness varied widely depending on which principal plane of the sapphire substrate was off-oriented to grow the nitride based compound semiconductor layer, and the surface flatness could not be attained when the off-oriented degree was too small, as well as it was necessary to consider its direction of the tilt for leading to a final device of high performance, for example, particularly when being used as a laser diode (LD), depending on the direction of the tilt, a fine cleavage surface could not be attained and the threshold current density could not be sufficiently reduced in some cases.

Further, the present inventors have found that the surface flatness is superior by adjusting a tilt of C plane of the sapphire substrate with the tilt $\theta_a$ on an A axis and with the tilt $\theta_m$ on a M axis in which A and M axes are relatively orthogonal to each other and simultaneously by off-orienting the overall tilt $\theta = \{\theta_a^2 + \theta_m^2\}^{1/2}$ not less than 0.2° and not more than 0.3°, and it is possible to lower the distortion of the cleavage surface and to highly reduce the threshold current (density) by raising $\theta_a$ in taking the cleavage surface as A plane and raising $\theta_m$ in taking the cleavage surface as M plane when being used as a laser diode (LD).

A semiconductor light emitting device in accordance with the present invention comprises; a sapphire substrate, and a laminated semiconductor portion in which nitride based compound semiconductor layers are laminated so as to constitute a light emitting layer forming portion on the sapphire substrate, wherein a C plane of the sapphire substrate has the off orientation angle having a tilt relative to an A axis and/or a M axis in such a way that $$0.2° \leq \theta = \{\theta_a^2 + \theta_m^2\}^{1/2} \leq 0.3°,$$

wherein $$0°≤θ_a≤0.3°, 0°≤θ_m≤0.3°$$

when taking the angle tilted relative to the A axis as $θ_a$ and to the M axis as $θ_m$, and the nitride based compound semiconductor layers are laminated onto the surface of the off-oriented C plane. Further, the laminated semiconductor portion may be laminated so as to constitute a light emitting diode structure or a laser diode structure.

Here, a nitride based compound semiconductor means a semiconductor consisting of compound of the Group III element(s) such as Ga, Al, In and the like and N, or N and the Group V elements other than N. Accordingly, this means a semiconductor consisting of N-containing compound semiconductor, in which in addition to GaN, a mixed crystal composition ratio of the Group III elements or a mixed crystal composition ratio of the Group V elements is appropriately changed, such as AlGaN based compound in which a composition ratio between Al and Ga is changeable and InGaN based compound in which a composition ratio between In and Ga is changeable.

By composing in such a manner, the surface of the growing nitride based compound semiconductor layer became highly flat, the nitride based compound semiconductor layer having a high crystallinity could be attained and the semiconductor light emitting device having a superior light emitting characteristic of such as a high light emitting efficiency could be attained. That is, while the surface roughness of the growing nitride based compound semiconductor layer became rough particularly in θ smaller than 0.2°, and the surface roughness which corresponded to the height differences between the concavity and the convexity was 37 nm on average, for example, at θ=0.16°, the same surface roughness was 16 nm on average at θ=0.23°.

A semiconductor laser in accordance with the present invention is formed, in the semiconductor light emitting device as set forth in claim 1, by forming the light emitting layer forming portion so as to constitute a semiconductor laser structure, as well as by cleaving the sapphire substrate in such a way that a laser beam exit edge surface is in parallel with the A plane of the sapphire substrate, when $θ_a$ is larger than $θ_m$, or by cleaving it in such a way that a laser beam exit edge surface is in parallel with the M plane of the sapphire substrate, when $θ_a$ is smaller than $θ_m$.

By fabricating in this structure, the semiconductor laser, in which off-orienting hardly affects the cleavage surface, having a highly superior light emitting characteristic may be attained, while the laser diode (LD) is formed using the off-oriented substrate. Further, as for a relation which of $θ_a$ and $θ_m$ is bigger, it is preferred that either $θ_a$ or $θ_m$ to be raised is raised more than the other as far as possible because this allows the effect on the cleavage surface resulting from off-orienting to be reduced. The rate of the larger one in comparison with smaller one is preferably twice or more.

In this case, a mask layer having a plurality of opening parts which cannot be directly grown as a semiconductor layer is provided on the sapphire substrate, and the laminated semiconductor portion is formed by laminating semiconductor layers so as to constitute a semiconductor laser on a lateral growth semiconductor layer grown epitaxially laterally from the opening parts onto the mask layer.

Specifically, the opening parts are provided side by side in stripe, and the laminated semiconductor portion is formed in such a way that a current injection region in stripe form is formed along one of the opening parts in stripe form in the laminated semiconductor portion near the one of the opening parts.

Furthermore, it is possible to grow a semiconductor layer having a further higher crystallinity by forming a concave part along the direction of the opening parts in stripe form in the mask layer under a part of the laminated semiconductor portion, in which the current injection region in stripe form is formed, or by forming a space along the direction of the opening parts in stripe form between the mask layer under a part of the laminated semiconductor portion, in which the current injection region in stripe form is formed and the lateral growth semiconductor layer.

DETAILED DESCRIPTION

Figure 1:
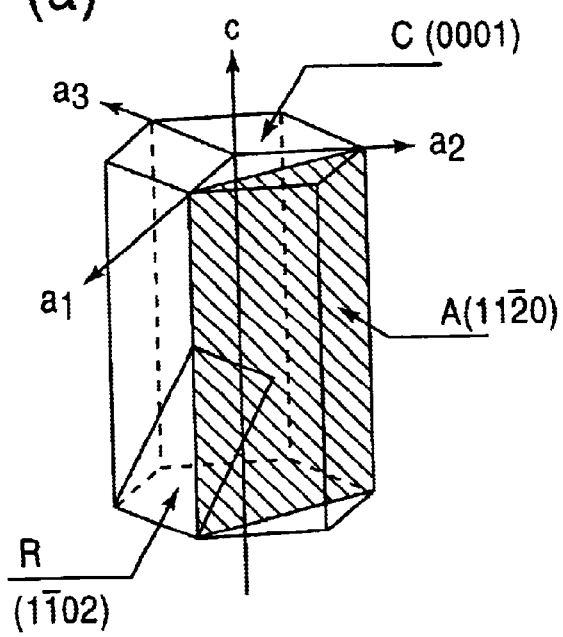
FIG. 1 is a view illustrating a plane direction and the direction to be off orientation of a sapphire substrate used in a semiconductor light emitting device in accordance with the present invention.
Figure 1:
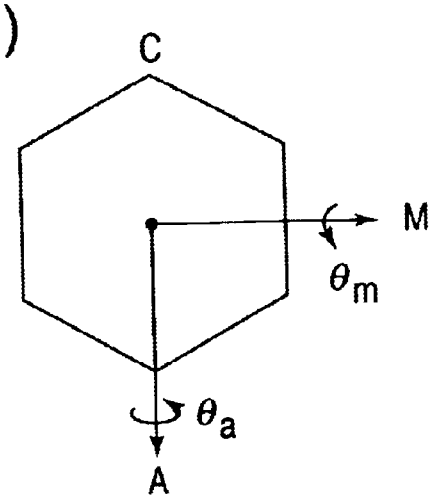
Figure 1:
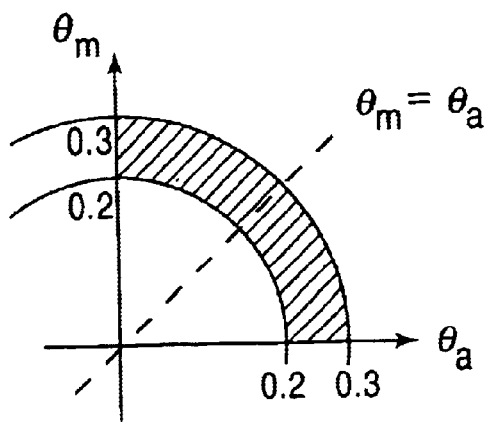
Figure 2:
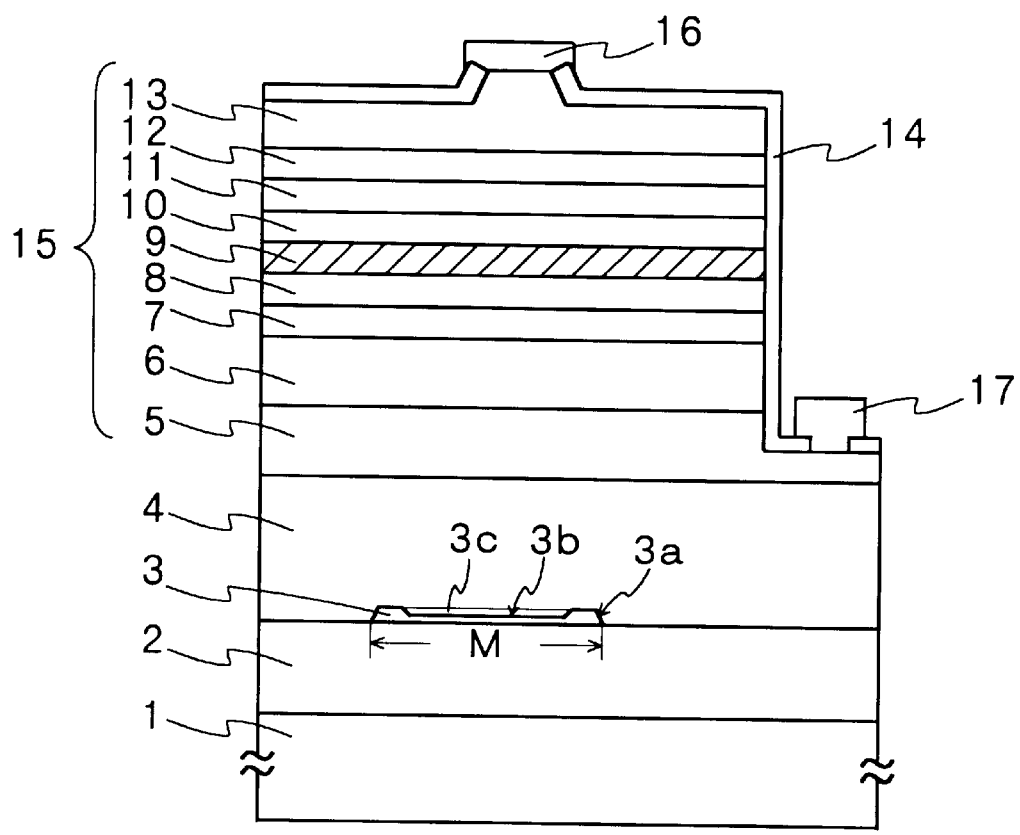
FIG. 2 is an illustrating sectional view of one embodiment of a semiconductor laser in accordance with the present invention.

Next, a semiconductor light emitting device of the present invention and a semiconductor laser which is one example thereof will be described referring to the drawings. In a semiconductor light emitting device in accordance with the present invention, as a sectional structure of a LD chip which is one embodiment thereof is shown in FIG. 2, when a laminated semiconductor portion 15 of nitride based compound semiconductor is formed so as to constitute a light emitting layer forming portion on the sapphire substrate 1, the C plane of the sapphire substrate 1 has the off orientation angle having a tilt relative to the A axis and/or the M axis in such a way that $$0.2°≤θ=\{θ_a^2+θ_m^2\}^{1/2}≤0.3°,$$

wherein $$0°≤θ_a≤0.3°, 0°≤θ_m≤0.3°$$

when taking the angle tilted relative to the A axis as $θ_a$ and to the M axis as $θ_m$, and the nitride based compound semiconductor layers are laminated onto the surface of the off-oriented C plane. Further, a plane direction of the C plane or the like, a relation between the A axis and the M axis, and a relation between $θ_a$ and $θ_m$, respectively, are shown in FIG. 1. In addition, a hatched portion in FIG. 1(c) represents a region of preferred off orientation angle.

As described above, the present inventors studied seriously to make the surface of the semiconductor layer of gallium nitride based compound semiconductor flat, and therefore have found that when, while the tilt of C plane of the sapphire substrate is adjusted with the tilt $θ_a$ on the A axis and with the tilt $θ_m$ on the M axis which is orthogonal to the A axis, the overall tilt $θ=(θ_a^2+θ_m^2)^{1/2}$ is changed, the surface flatness could not be attained if the off orientation angle θ was too small and the semiconductor light emitting device having a superior characteristic as a device could not be attained if a relation between the cleavage surface and the tilted axis was not considered particularly when being used as LD.

Figure 4A:
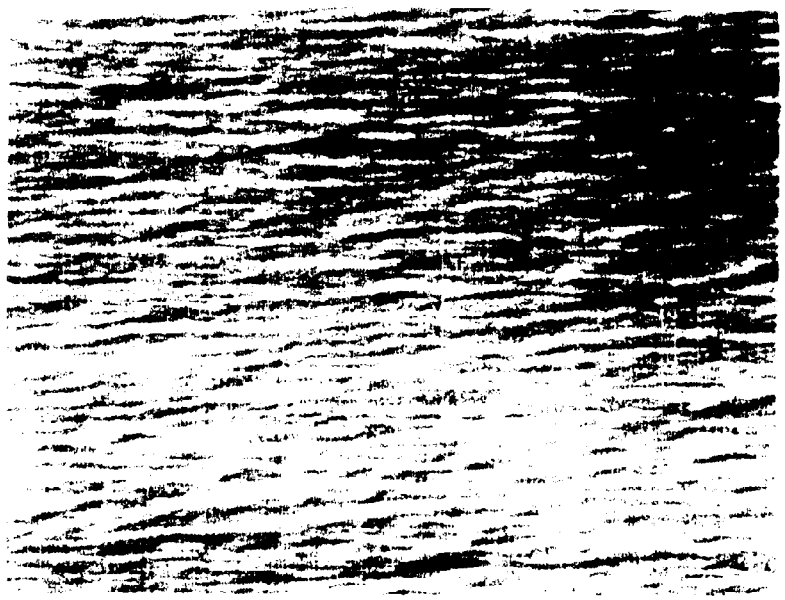
FIG. 4 is a microscopic photograph illustrating the appearances of the surface roughness of the semiconductor layer in the cases of θ=0.23° and θ=0.16°.
Figure 4B:
Figure 5:
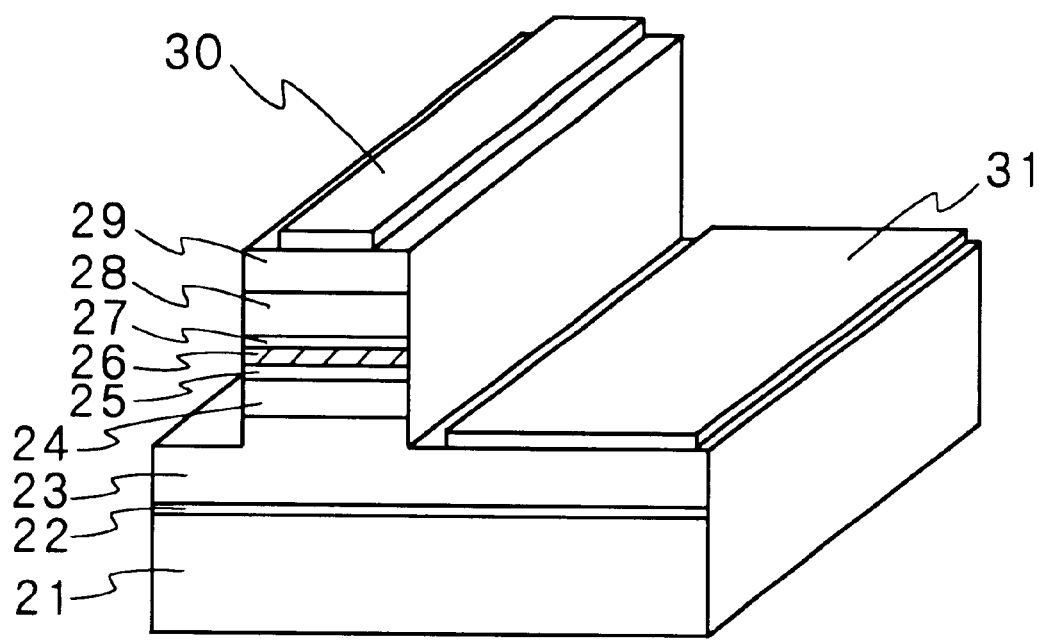
FIG. 5 is an illustrating sectional view showing an example of a conventional blue type semiconductor laser.

That is, using the sapphire substrates of varying off-oriented θ (degree), a GaN layer was grown on the surface of each of the substrates, and the surface of the growing layer was investigated by the image of an atomic force microscope (AFM). The analyzing results indicated that though the surface roughness which was the height differences of the surface was small in a range of $0.2° \leq \theta \leq 0.3°$, the surface roughness became extremely large when θ was smaller than 0.2°, and it is not preferred also when θ was larger than 0.3°. The surface states by a metallurgical microscope photograph are shown in FIGS. 4(a) and 4(b), respectively when θ=0.23° ($\theta_a$=0.23°, $\theta_m$=0.03°) and θ=0.16° ($\theta_a$=0.16°, $\theta_m$=0.02°). In FIG. 4(a) and 4(b), the height differences are expressed by the contrast of the photograph, and the white areas indicate the surface side portions and the dark areas the recessed portions. It is shown that whereas the concavity and the convexity in particle form are observed in the case of θ=0.16° of FIG. 4(b), the concavity and the convexity in particle form are hardly observed in FIG. 4(a) represents the case of θ=0.23° of the present invention, and the flat layer is grown. Incidentally, as a results of analyzing the degree of the concavity and the convexity in the case by an AFM, whereas the surface roughness was 16 nm on average at θ=0.23° of FIG. 4(a), it was 37 nm on average at θ=0.16° of FIG. 4(b).

The present inventors further fabricated the samples of LD chips of structure shown in FIG. 2 varying in the tilted angles relative to the A axis and the M axis and laser beam exit edge surface (cleavage surface) and investigated the threshold current density ($kA/cm^2$) to study the effects of the tilt around the A axis and the M axis when off orientation angle is provided. The measurements are given in Table 1.

TABLE 1 relation between off orientation angle and threshold current density

| Sample No. | θ (degree) | $\theta_a$ (degree) | $\theta_m$ (degree) | Laser beam exit edge surface | Threshold current density ($kA/cm^2$) |
|---|---|---|---|---|---|
| 1 | 0.01 | 0.01 | 0.01 | A plane | 15 |
| 2 | 0.26 | 0.25 | 0.07 | A plane | 12 |
| 3 | 0.28 | 0.26 | 0.09 | M plane | 15 |
| 4 | 0.26 | 0.05 | 0.25 | A plane | 15 |

Though, also in this Table 1, the results that the threshold current density was unfavorably large as well as the above-mentioned result when θ is 0.01° was obtained, the threshold current density was unfavorably the same 15 $kA/cm^2$ as the case of θ=0.01° even when θ is 0.28° or 0.26° as the samples 3 and 4. On the other hand, in the sample 2, the threshold current density was preferably 12 $kA/cm^2$ at θ=0.26°. The cause of the difference between the sample 2 and the sample 3 was that though the off orientation angle of the sample 2 is almost similar to the sample 3, the laser beam exit edge surface (cleavage surface) was changed from the A plane to the M plane. That is, it is understood that the cleavage hardly has a problem even though the tilt around the A axis is large when the A plane is the cleavage surface but the edge surface was distorted and the threshold current was increased since the cleavage surface is not easily to become mirror-smooth state when the M plane is the cleavage surface and the tilt around the A axis is large.

This was also similar in sample 4, and the edge surface was distorted and the threshold current (density) became large when the A plane is the cleavage surface and the tilt around the M axis is large. That is, it was found that the degree of flatness of the nitride based compound semiconductor layer growing thereon became high, and the distortion of the cleavage surface might be lowered so that the threshold current (density) might be highly lowered by adjusting the above-mentioned θ to be in a range of from 0.2° to 0.3° while raising $\theta_a$ in the case of letting the cleavage surface in parallel with the A plane and raising $\theta_m$ in the case of letting the cleavage surface in parallel with the M plane.

There is shown an illustrating sectional view of a LD chip which is one embodiment of the present invention in FIG. 2. That is, in the semiconductor laser in accordance with the present invention, a sapphire ($Al_2O_3$ single crystal) substrate, in which the off orientation angle of the C plane to be in a range of from 0.2° to 0.3° while, as described above, letting $\theta_a > \theta_m$ in cleaving the substrate to be in parallel with the A plane and letting $\theta_a < \theta_m$ in cleaving the substrate to be in parallel with the M plane, is prepared, and a laminated semiconductor portion 15 consisting of nitride based compound semiconductor is formed on the surface of the substrate 1. Then, the LD chip shown in FIG. 2 is fabricated by cleaving at the predetermined cleavage surface.

In the example illustrated in FIG. 2, a first nitride based compound semiconductor layer 2 is provided on the substrate 1 having the off orientation angle, a mask layer 3 having the opening parts 3a is provided on the layer 2, a second nitride based compound semiconductor layer (lateral growth semiconductor layer) 4 selectively grown laterally from the opening parts 3a on the mask layer 3 and further the laminated semiconductor portion 15, which is laminated so as to form a light emitting layer having a light emitting part in stripe, consisting of nitride based compound semiconductor is provided on the layer 4. That is, to reduce the threading dislocation, ELO (Epitaxial Lateral Overgrowth) is performed. Thus, it is preferred since the dislocation density is reduced, but it is not necessarily limited to this structure.

The first nitride based compound semiconductor layer 2 is formed, for example, by a common epitaxial growth of a non-doped GaN in about 4 μm by a MOCVD method and is to be employed as a seed at the time of selective growth of the second nitride based compound semiconductor layer 4, which will be described later. Nevertheless, if it is possible to carry out nitride based compound semiconductor layer growth using a semiconductor substrate of such as Si or a sapphire substrate as a seed even in the case where the first nitride based compound semiconductor layer is not formed, the first semiconductor layer can be omitted. The mask layer 3 is formed in about 200 nm thickness by sputtering a material, for example, $SiO_2$, $Si_3N_4$, W or the like, on which a semiconductor layer cannot directly epitaxially be grown. The mask layer 3 is for avoiding the second semiconductor layer from directly being formed on the surface of the substrate 1 or the first GaN layer 2 and as long as it is formed as to satisfactorily perform the function as a mask, the mask layer is more preferable to be thinner since steps are hardly formed if it is thin.

After the mask layer 3 is provided overall on the first nitride based compound semiconductor layer 2 in a wafer state, it is patterned so as to have the opening parts 3a along the light emitting part in stripe, and further, in the example illustrated in FIG. 2, a concave part 3b is formed on the surface side of the remaining mask layer 3 which is left after patterning leaving the width of about 2 μm from the opening parts. The width M of the mask layer 3 is formed approximately in 20 μm. Further, in FIG. 2, the mask layer 3 is shown only under the portion forming a light emitting layer, but actually the mask layer is repeatedly provided(appeared) also on the lateral side of the light emitting layer forming portion through the opening parts 3a of 10 to 20 μm in width (a stripe part is shown under magnification in the drawing). Moreover, a part which corresponds to the length of the current injection region in stripe of a semiconductor laser chip may be formed near the opening parts without being obstructed by the opening parts even though all of the opening parts are not in stripe.

A concave part 3b formed on the surface of the mask layer 3 is formed in depth of about a half of thickness of the mask layer 3, i.e., about 100 nm by forming a resist film mask again after the opening parts 3a are formed and etching with HF water solution. Accordingly, the widths, respectively, of about 2 μm from the opening parts are left, and the concave part 3b is formed on the surface of the mask layer 3 between the opening parts except about 2 μm width from the opening parts. The reason why the widths of about 2 μm are provided is to prevent the concave part from being exposed to the opening parts side due to the variation of fabricating conditions. The concave part 3b is provided to prevent the contact stress on the second semiconductor layer 4 growing laterally and to help the semiconductor layer 4 to grow straight laterally. Accordingly, a structure in which a space (gap) is formed between the mask layer 3 and the second semiconductor layer 4 instead of forming the concave part clearly may be used.

The second nitride based compound semiconductor layer 4 is, for example, an about 20 μm-thick non-doped GaN layer. The semiconductor layer 4 is started growing while using the first GaN layer 2 exposed to the opening parts 3a of the mask layer 3 as a seed and selectively grown in the lateral direction when it reaches the surface of the mask layer 3. That is, since GaN layer is grown faster with more excellent crystallinity in the lateral direction than in the vertical direction, although the recessed parts 3b are formed in the mask layer 3, the layer is scarcely grown in the lower side but grown in the lateral direction while keeping gaps 3c to the mask layer 3 and also grown slightly in the upper side and finally joined to itself around the center parts of the mask layer 3 while being grown in the lateral direction in both ends of each opening part. Then, after the surface of the mask layer 3 are completely buried, the second GaN layer (a semiconductor layer) 4 is grown upward to completely cover the mask layer 3. The resultant second GaN layer 4 has excellent crystallinity in the portions other than the portions in both end parts of the mask layer 3 (the portions contacting the opening parts 3a) and the joining parts in the center parts and the dislocation density is lowered by one figure.

The laminated semiconductor portion 15 on the second GaN layer 4 is so formed to be a laminated semiconductor portion as to constitute a common semiconductor laser structure. That is, the laminated semiconductor portion 15 is formed by successively laminating an about 0.5 μm thick n-type contact layer 5 of n-type GaN doped with, for example, Si of about $5 \times 10^{18}$ cm$^{-3}$, an about 0.4 μm thick n-type clad layer 6 of n-type $Al_{0.08}Ga_{0.92}N$ doped with, for example, Si of about $5 \times 10^{18}$ cm$^{-3}$, an about 0.2 μm thick n-type first guide layer 7 of n-type GaN doped with, for example, Si of about $1 \times 10^{18}$ cm$^{-3}$, an about 50 nm thick n-type second guide layer 8 of n-type $In_{0.01}Ga_{0.99}N$ doped with, for example, Si, an about 50 nm-thick active layer 9 having a multiple quantum well (MQW) structure comprising 5 well layers of about 5 nm-thick $In_{0.1}Ga_{0.9}N$ successively and reciprocally stacked on about 5 nm-thick barrier layers of $In_{0.02}Ga_{0.98}N$, an about 20 nm thick p-type cap layer 10 of $Al_{0.2}Ga_{0.8}N$ doped with, for example, Mg, an about 0.1 μm thick p-type guide layer 11 of GaN, doped with, for example, Mg of about $1 \times 10^{18}$ cm$^{-3}$, an about 0.4 μm thick p-type clad layer 12 of $Al_{0.08}Ga_{0.92}N$ doped with, for example, Mg of $2 \times 10^{17}$ cm$^{-3}$, and an about 0.1 μm thick p-type contact layer 13 of GaN doped with, for example, Mg of about $3 \times 10^{18}$ cm$^{-3}$.

The structure of the laminated semiconductor portion 15 and the material for each layer are not at all restricted to those exemplified above and the active layer 9 may not be a quantum well structure but be a bulk structure and the active layer 9 of a material determined by the desired wavelength of emitted light is so composed as to be sandwiched between clad layers 6, 12 made of materials having band gaps wider than that of the active layer 9. In case of composing a semiconductor laser as shown in FIG. 2, the active layer 9 is made of a material having a refractive index higher than those of the materials for the clad layers 6, 12. Owing to that, light can be closed in the active layer 9 and if the active layer 9 is thin and cannot sufficiently close the light, as shown in FIG. 2, light guide layers 7, 8, 11 having refractive indexes between that of the active layer 9 and those of the clad layers 6, 12 are formed. However, if the active layer 9 is capable of sufficiently close light, it is no need to form the light guide layers 7, 8, 11.

The p-type contact layer 13, the uppermost layer of the laminated semiconductor portion 15, is subjected to mesa-etching, and a part of the laminated semiconductor portion 15 is etched to expose the n-type contact layer 5, and a $SiO_2$ film is formed on the entire surface to form the protective film 14. After that, the p-side electrode 16 of Ni—Au is formed on the mesa part of the p-type contact layer 13 through the contact hole of the protective film 14 and the n-side electrode 17 of Ti—Al is formed as being electrically connected with the n-type contact layer. Finally, the resultant layered structure is cleaved as to have resonance length of 500 μm (the length in the perpendicular direction to the sectional plane of FIG. 2) and compose the laser (LD) chip shown in FIG. 2.

With this layered structure, the mesa-type parts in stripes of the p-type contact layer 13 become current injection regions (in the case where the p-side electrode is formed in stripes, stripe type current injection region is formed even if the contact layer 13 is not formed to be mesa type) and the mask layer 3 and the p-side electrode 16 are formed while being conformed to each other as to position a half or less of the stripe type recessed part 3b formed on the mask layer 3.

Figure 3:
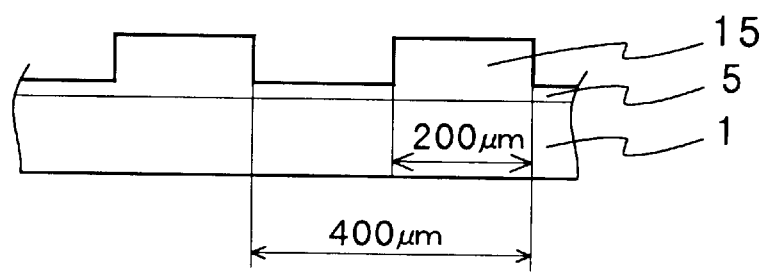
FIG. 3 is an illustrating view of an example of a pattern of etching the laminated semiconductor portion after laminating semiconductor layers.
Figure 3:
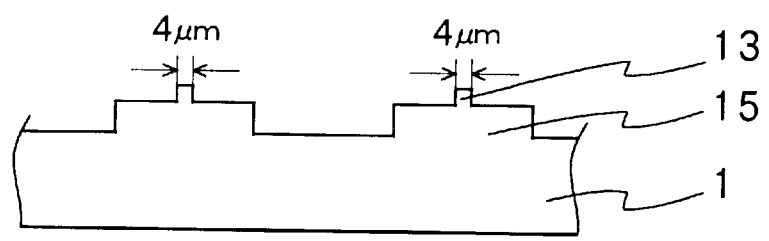

Next, the method for fabricating (manufacturing) such a semiconductor laser will be described. Using an epitaxial growth apparatus by, for example, MOCVD method, a substrate is thermally cleaned in $H_2$ gas atmosphere at 1100° C. substrate temperature. After that, trimethylgallium (TMG) as a Ga raw material gas and ammonia ($NH_3$) as a N raw material gas are introduced to grow a non-doped first GaN layer 2 in about 4 μm thickness. Then, the resultant substrate is taken out the growth apparatus and using, for example, a sputtering apparatus, a $SiO_2$ film in about 200 nm thickness is formed thereon. After that, a resist layer is formed on the $SiO_2$ film, patterned, and the $SiO_2$ film is etched using an aqueous HF solution to form opening parts and to form mask layer 3. Moreover, a resist film 18 is formed on the entire surface and patterned to form opening in the portion where the recessed parts 3b is to be formed. Then, etching with an aqueous HF solution is again carried out to form stripe type recessed part 3b (in the perpendicular direction to the sectional plane of FIG. 3) as shown in FIG. 3.

After that, the resultant substrate is again put in a growth apparatus such as a MOCVD apparatus and necessary gases such as trimethylaluminum (TMA) and trimethylindium (TMIn) as raw material gas of Al and In, respectively, as well as the foregoing gases, SiH$_4$ as the n-type dopant or cyclopentadienyl magnesium (Cp$_2$Mg) or dimethyl zinc (DMZn) as p-type dopant are introduced together with carrier gas to grow the second nitride based compound semiconductor layer 4 and respective semiconductor layers of the laminated semiconductor portion 15 in respectively above described thickness. In this case, the first n-type guide layer 7 and those before the layer 7 are grown at the substrate temperature of 1050° C. and the second n-type guide layer 8 and the active layer 9 are grown at the substrate temperature of 770° C. and the respective layers after these are grown again at the substrate temperature of 1050° C.

On completion of the growth of the respective semiconductor layers, the substrate is taken out of the growth apparatus and a resist mask is put on the surface, a part of the laminated semiconductor portion 15 is etched by a Reactive Ion Beam Etching (RIBE) apparatus in 200 µm width in the cycle of 400 µm as shown in FIG. 3(a) to expose some of n-type contact layer 5. Further, the resist mask is removed and then another resist mask is put again, mesa etching is carried out by the same apparatus as to leave the p-type contact layer 13 in about 4 µm width as shown in FIG. 3(b). After that, using a film growth apparatus such as a plasma CVD, a protective film 14 of such as SiO$_2$ is formed in about 200 nm thickness on the entire surface and the parts where electrodes are to be formed are etched by a HF-type etchant to form contact holes.

After that, as the p-side electrode 16, a Ni film of 100 nm thickness and a Au film of 200 nm thickness are formed respectively by a vacuum evaporation apparatus and further as the n-side electrode 17, a Ti film of 100 nm thickness and an Al film of 200 nm are formed to obtain the electrodes 16, 17 and the rear side of the resultant substrate 1 is polished to be as thin as about 60 µm and cleave at the parallel plane with the A-plane or M-plane according to the aforementioned off orientation angle, as to keep the resonance length of about 500 µm to complete a LD chip.

In accordance with the present invention, since the off orientation is precisely formed considering the tilt in the direction of the A axis or the M axis corresponding to, for example, the exit surface of LD unlike only using the off-oriented substrate in the sapphire substrate, the surface of the semiconductor layer is made flat as well as the light emitting characteristic may be significantly enhanced, and further a large effect is obtained particularly in applications to laser diode.

Although the foregoing exemplified one is a semiconductor laser with the stripe structure in which the p-type contact layer 13 is simply mesa type stripes, it may be sufficient to form only the p-side electrode in stripe without etching the contact layer or to form mesa type structure almost near to the active layer or to form a proton implanted type structure by implanting protons. Further, the semiconductor laser may be formed in an index guiding structure in which the current blocking layer is buried.

In accordance with the present invention, since the degree of flatness of the layer of epitaxial growth of the nitride based compound semiconductor layer is improved, the light emitting efficiency of LED may be increased and the threshold current density of LD may be reduced, therefore the semiconductor light emitting device of very high performance may be attained. Particularly in the case of LD, since the relation between the direction of off orientation and the cleavage surface is optimized, the distortion does not develop particularly at the cleavage surface, and the light emitting characteristic is significantly enhanced.

Although preferred examples have been described in some detail it is to be understood that certain changes can be made by those skilled in the art without departing from the spirit and scope of the invention as defined by the appended claims.

What is claimed is:

1. A semiconductor light emitting device comprising:

a sapphire substrate; and a laminated semiconductor portion in which nitride based compound semiconductor layers are laminated so as to form a light emitting structure, on a plane which has an off orientation angle θ on the basis of a C plane of said sapphire substrate, wherein the C plane of said sapphire substrate is oriented by orthogonal M, A and C axes, the off orientation angle θ has an A-axis tilt angle θ tilting relative to the A axis and/or an M-axis tilt angle $\theta_m$ tilting relative to the M axis, and the off orientation angle θ, the A-axis tilt angle $\theta_a$, and the M-axis tilt angle $\theta_m$ satisfy the following conditions:

$$0.20° \leq \theta = \{\theta_a^2 + \theta_m^2\}^{1/2} \leq 0.30°, \ 0° \leq \theta_a \leq 0.3°, \text{ and } 0° \leq \theta_m \leq 0.3°.$$

2. The semiconductor light emitting device of claim 1, wherein said laminated semiconductor portion is formed so as to constitute a light emitting diode structure.

3. A semiconductor laser, wherein, in the semiconductor light emitting device as set forth in claim 1, said laminated semiconductor portion is formed so as to constitute a semiconductor laser structure, and wherein said sapphire substrate is cleft in such a way that a laser beam exit edge surface is in parallel with the A plane of said sapphire substrate, when $\theta_a$ is larger than $\theta_m$.

4. A semiconductor laser, wherein, in the semiconductor light emitting devise as set forth in claim 1, said laminated semiconductor portion is formed so as to constitute a semiconductor laser structure and wherein said sapphire substrate is cleft in such a way that and a laser beam exit edge surface is in parallel with the M plane of said sapphire substrate, when $\theta_a$ is smaller than $\theta_m$.

5. The semiconductor laser as set forth in claim 3 or 4, wherein a mask layer having a plurality of opening parts which can not be directly grown as semiconductor layer is provided on said sapphire substrate, and said laminated semiconductor portion is formed by laminating semiconductor layers so as to constitute a semiconductor laser on a lateral growth semiconductor layer grown epitaxially and laterally from said opening parts onto said mask layer.

6. The semiconductor laser as set forth in claim 5, wherein said opening parts are provided side by side in stripe form and said laminated semiconductor portion is formed in such a way that a current injection region in stripe form is formed along one of said opening parts in stripe form in said laminated semiconductor portion near said one of said opening parts.

7. The semiconductor laser as set forth in claim 6, wherein a concave part is formed along the direction of said opening parts in stripe form in said mask layer under a part of said laminated semiconductor portion, in which said current injection region in stripe form is formed.

8. The semiconductor laser as set forth in claim 6, wherein said laminated semiconductor portion is formed in such a way that a space is form along the direction of said opening parts in stripe form between said mask layer under a part of said laminated semiconductor portion, in which said current injection region in stripe form is formed and said lateral growth semiconductor layer.

* * * * *